United States Patent
Buchsbaum et al.

(10) Patent No.: US 6,638,668 B2
(45) Date of Patent: Oct. 28, 2003

(54) METHOD FOR MAKING MONOLITHIC PATTERNED DICHROIC FILTER DETECTOR ARRAYS FOR SPECTROSCOPIC IMAGING

(75) Inventors: Philip E. Buchsbaum, Oldsmar, FL (US); Michael J. Morris, Dunedin, FL (US)

(73) Assignee: Ocean Optics, Inc., Dunedin, FL (US)

( * ) Notice: Subject to any disclaimer, the term of this patent is extended or adjusted under 35 U.S.C. 154(b) by 285 days.

(21) Appl. No.: 09/855,077

(22) Filed: May 14, 2001

(65) Prior Publication Data

US 2002/0094484 A1 Jul. 18, 2002

Related U.S. Application Data

(60) Provisional application No. 60/203,654, filed on May 12, 2000.

(51) Int. Cl.⁷ ............... G02B 5/20; G03F 7/00
(52) U.S. Cl. ............................. 430/7; 430/321
(58) Field of Search ...................... 430/7, 321

(56) References Cited

U.S. PATENT DOCUMENTS 5,120,622 A * 6/1992 Hanrahan ............... 430/7
5,711,889 A * 1/1998 Buchsbaum ............. 216/5

FOREIGN PATENT DOCUMENTS

JP     59-152407 A  *  8/1984

* cited by examiner

*Primary Examiner*—John A. McPherson
(74) *Attorney, Agent, or Firm*—Dennis L. Cook, Esq.; Fowler White Boggs Banker, P.A.

(57) ABSTRACT

A monolithic patterned dichroic filter array is mounted on a wafer by combining microelectronic and microlithography techniques. A wafer is coated with a photoresist. The assembly is masked, and the unmasked photoresist, after exposure to ultraviolet light, is developed to expose a predetermined section. That section of wafer is then over developed to create an undercut in its walls and to expose the underlying wafer. Dichroic filter material is then deposited onto the wafer by a cold process, and the photoresist layer is then removed, leaving only the dichroic filter material on the wafer. The process is repeated to create an array. The finished wafer is then bonded to a linear or two dimensional detector array, or to a glass window that is then bonded to a linear or two dimensional detector, to create a high performance spectral detector for spectroscopic imaging. When placed on a two dimensional detector in a camera, an imaging system capable of showing spatial variation in color, chemicals or other spectrally dependent parameters is produced.

26 Claims, 4 Drawing Sheets

METHOD FOR MAKING MONOLITHIC PATTERNED DICHROIC FILTER DETECTOR ARRAYS FOR SPECTROSCOPIC IMAGING

CROSS-REFERENCE TO RELATED APPLICATION

The present application claims the benefit of previously filed abandoned Provisional Patent Application, Serial No. 60/203,654, filed May 12, 2000.

FIELD OF THE INVENTION

This invention relates, generally, to methods for making an improved detector array and more specifically a method for making a monolithic patterned dichroic filter detector array for spectroscopic imaging by coupling a patterned dichroic filter to a linear or two dimensional detector array such as a Charge Coupled Device, and the like.

BACKGROUND OF THE INVENTION

Color-dyed gels positioned in front of detector arrays are currently employed to produce spectral detectors. The gels have a number of shortcomings, however, that limit their utility. For example, they do not function over a wide temperature range and thus cannot meet strict specifications of the type that might be called for in military applications, for example. Moreover, gels absorb relatively high levels of light and thus require more power to produce a desired detection level than would a less absorptive material. Moreover, the colors of the gels are not easily controlled during their manufacture, it is difficult to formulate gels with specific spectral features, and the filtering and transmitting of colors is problematic.

Gel and absorptive technology has been used to make red green blue sensitive cameras for the detection of color. Attempts have been made, with limited success, to relate these visual color functions to the estimation of certain chemical parameters. Alternatively, non-imaging or single point measurements made with spectrometers have been widely used with great success to relate the reflection or transmission of a variety of wavelengths to the concentration or level of many industrial, medical and environmental parameters.

It has been recognized by the art that a dichroic or interference filter array would be superior to gels in numerous respects when used in conjunction with linear or two dimensional detectors such as CCDs, due to the superior optical qualities of a dichroic filter as compared to that of gels. Dichroic filters, also known as interference filters, are constructed by depositing one or more layers of metallic and dielectric films with precise thicknesses to produce filters which transmit certain wavelengths of light and reflect others. The colors of a dichroic filter can be predicted and manufactured to match spectral functions such as the CIE tristimulus curves s (e.g. the 1976 UCS standard chromaticity diagram), and such filters enable purer color filtering and transmission compared to gels due to their higher extinction ratio at wavelengths which are blocked and higher transmission at wavelengths that are passed. They are temperature stable from a range of about −40 degrees to 400 degrees F.; they absorb less than five percent (5%) of the light transmitted through them as they are primarily rejecting out of band wavelengths through reflection; and, for in band wavelengths, they exhibit a ninety percent (90%) transmission and thus require less power to achieve greater brightness.

The industry still uses gels, however, because it has been unable to overcome the manufacturing difficulties encountered in making an array of dichroic filters on a wafer. A typical array includes a plurality of discrete filters arranged in rows and columns on the face of the wafer. The manufacturing of dichroic filter arrays is problematic because it is difficult to manufacture a thin filter unit having sharply defined edges. If a filter unit is too thick, it absorbs too much light and thus requires high power consumption if a good image is to be produced, just like a gel. If the edges are not sharply defined, it produces low quality, hard to control color, just like a gel. These limitations exist in the manufacture of dichroic filter arrays because the art has attempted to make optical filter arrays employing etching techniques that have never been perfected. Thus, although in theory a dichroic filter array should perform better than an array of gels, in practice the thick, poorly defined dichroic filters perform just as poorly. Several large corporations, including electronic giants such as Sony, have spent millions of dollars over several years trying, without success, to develop arrays of thin, sharply edged dichroic filters on a wafer to replace the gels. However, the efforts have been futile because they are based on refinements of the optical arts. Specifically, the efforts relate to improvements in etching techniques that are designed to reduce the filter thickness and to sharpen the filter edges. More particularly, in the etching process, the filter material is deposited onto a wafer by an evaporation technique known as "hot process," and a protective film of copper or other suitable material is then deposited atop the filter. A photoresist layer is then deposited atop the copper; the result is a sandwich including, from the top, a layer of photoresist, a layer of protective copper, the filter material, and a wafer. Efforts are then made to etch away the photoresist and the edges of the filter material so that a square or rectangular block of filter material is left on the wafer. The copper layer immediately atop the filter material must also be etched away, but the contiguous copper must be left in place to protect the contiguous filter material when the etching is repeated to form the next block of filter material. Due to the small sizes of the filters (typically, a filter is about 20 microns in width), and since each filter must abut a contiguous filter, the task of producing an array of thin filters with sharply defined edges by conventional etching techniques is nearly impossible, as proven by the years of expensive yet unsuccessful research mentioned above.

The above problem was solved as applied to LCDs to produce color images and disclosed in U.S. Pat. No. 5,711,889, Method For Making Dichroic Filter Array, which is hereby fully incorporated into this specification.

The improvement now disclosed by this specification relates to the application of the Dichroic Filter Array shown in U.S. Pat. No. 5,711,889 to detectors thus producing the first high resolution application of dichroics in a CCD application to make imaging systems capable of color, chemical or composition related parameter detection.

This improved technology captures the analytical specificity of spectral analysis in a monolithic thin film optical filter or filters, and places these filters over discrete sensors in an imaging sensor to produce spectrally discriminated images. In addition, the filter technology has no moving parts, long life expectancy, excellent optical efficiency, and high performance.

Using Microlithographic patterned vacuum deposited thin films, where these thin films produce optical filters with transmission characteristics designed to emulate the weighted spectral response of specific chemicals, composition related parameters such as octane number in fuels or cancerous tissue in optical biopsies, or other spectral functions of interest such as UVA, TVB and UVC bands of ultraviolet radiation, photopic curves, perceived color functions, industry specific standards such as APHA water color, or any spectrally dependent function, separate filters can be produced in a pattern to measure simultaneously several chemicals or parameters. The filters are cast in patterns that overlay the detector elements in imaging detectors such that, when they are placed on a two dimensional detector in a camera, an imaging system capable of showing spatial variation in chemicals or parameters is produced.

A further advantage of the disclosed invention is the ability to produce filters for both positive and negative factors in a spectral model, or for multiple chemical species. When these different filters are deposited on adjacent pixels, they combine to form a set of pixels from which the model result can be more accurately calculated. This combination of data from adjacent pixels is accomplished typically in software such that the model results are predicted across the whole detector array, forming a single image. As mentioned earlier typical detector arrays use patterned dye gels to produce color discrimination. Patents disclosing this technique, and attempting improvements on the state of the art generally include U.S. Pat. No. 5,719,074, Hawkins, et al, Feb. 17, 1998, Method of Making a Planar Color Filter Array for CCDS From Dyed And Mordant Layers. This patent discloses an image sensor that includes an integral color filter array and a method of making such sensor. The sensor includes a semiconductor substrate having an overlying support layer with an optically planar surface, a plurality of spaced image pixels formed in the substrate; and an array of contiguous color filter elements overlying the planar surface whose top surfaces are coplanar and which have no overlap of color filter material between adjacent color filter elements. Also, U.S. Pat. No. 5,756,239, Wake, May 36, 1998, Method of Forming a Color Filter Array With Improved Resolution, discloses a method for use in forming a high resolution color filter array in which the following steps are used: coating a colored layer containing a binder, a colorant in the binder, the binder being transparent over the entire visible electromagnetic spectrum and remaining so even after extended treatment with elevated temperature and light; hardening the colored layer; providing and patterning a photoresist layer over the hardened colored layer; and treating the patterned photoresist layer so that it is selectively resistant to oxygen plasma etch. Further processing steps are used to complete the colored filter array. U.S. Pat. No. 5,954,559, Holmberg, Sep. 21, 1999, Color Filter Structure and Method of Making, discloses an improved planar color filter structure to reduce defects in the display devices incorporating the color filter structures, including active matrix displays. A color filter substrate has a thicker polyamide black matrix formed thereon and a transparent polyamide layer formed over the black matrix. The transparent layer is exposed through the black matrix and developed to remove the unexposed portions over the black matrix. The resulting surface is substantially planar and facilitates the forming of the remaining layers to form a substantially planar color filter structure. These patents disclose use of dyes and gels patterned to form the color filter. No dichroics are used.

U.S. Pat. No. 5,889,227, Hawkins, et al, Mar. 30, 1999, Planar Color Filter Array For CCDS With Embedded Color Filter Elements, discloses an image sensor and method of making such sensor. The sensor includes an integral color filter array, comprising: a semiconductor substrate having an optically planar top surface; a plurality of spaced image pixels formed in the substrate; and an array of physically contiguous color filter elements embedded in the substrate whose top and bottom surfaces are coplanar and which have no overlap of color filter layers between adjacent color filter elements. This patent discloses a planar filter element created by etching rather than the liftoff method disclosed in U.S. Pat. No. 5,711,889, and thus is difficult to manufacture.

Also, a number of patents have been issued that disclose using dichroic filters with detectors. U.S. Pat. No. 5,942,762, Hecht, Aug. 24, 1999, CCD Scanner Having Improved Specular Reflection Discrimination, discloses an optical scanner that utilizes two linear CCD detectors and a bandpass means to improve the ability of the scanner to discriminate against specular reflection. A coded symbology is illuminated by a noncoherent light source and light reflected from the coded symbology along a first path strikes the front face of the bandpass means. The bandpass means, functioning as a notch filter, transmits a select bandwidth of light while reflecting all other light onto a first CCD detector. Simultaneously, light reflected from the bar code symbol travels along a second path, at a different angle with respect to the plane of the coded symbology than the first path, is reflected from a mirror onto the back face of the bandpass means. The bandpass means transmits the select bandwidth of light onto a second CCD detector and reflects all other light. The second CCD detector has a notch filter which permits the detection of only the select bandwidth. Since specular reflection is only experienced at a single angle, with respect to the plane of the coded symbology and each CCD detector detects an image at a different angle with respect to the plane of the coded symbology, a complete image can be reconstructed by combining information obtained from both CCD detectors. But this patent does not disclose patterning on a single CCD substrate. Also, U.S. Pat. No. 5,912,451, Gurevich, et al., Jun. 15, 1999, Moving Beam And Field Of View Readers With Dichroic Filter, discloses an optical reader for reading indicia such as bar codes comprises a first and second light source for generating first and second laser beams. The respective laser sources generate light at different wavelengths and a dichroic filter is provided to allow either source to be used without parallax effects. The laser scanner beam can be used to aim the reader when carrying out field of view reading. The optical reader is further provided with a band-pass filter shaped to match the wavefront of light generated at a given location incident on the filter to reduce the band-pass bandwidth and hence the ambient noise. The shaped band-pass filter can be incorporated in the optical reader dichroic filter arrangement. This is a single bandpass filter device with no patterning or direct placement on the detector as disclosed in this application.

These prior art devices consisted mainly of patterned dye gels to produce color discrimination. This is the first high-resolution application of dichroics in a CCD application. In addition, this permits the first use of a monolithic array of discrete optical filters to emulate mathematical filters or models in an imaging system. This allows for the imaging of differences in concentration of chemicals or in levels of composition related parameters with a low cost solid state device. The filters provide performance, wavelength selectivity, longevity, and flexibility of application. The array of filters are also monolithic allowing for greater thermal stability and physical durability

SUMMARY OF THE INVENTION

This breakthrough in optical filter detector array production is made possible by uniting two separate and divergent technologies. The art of microlithography has long been employed to produce microelectronic devices, and the optical arts have long been employed to produce dichroic filter arrays. As mentioned earlier, the optical arts have failed to produce thin filters having well-defined edges, and the art of microlithography has been limited to the field of microelectronics. The present invention merges the divergent arts of microlithography and microelectronics. A "cold process," well known in the art of microelectronics, is employed to deposit the filter material, in lieu of the conventional "hot process." Photoresist is applied to the wafer prior exposure and over development to create an undercut, thereby weakening the walls formed by the photoresist. The filter material is then deposited onto the wafer in the space created by the over development. The photoresist is then removed, thereby leaving on the wafer a thin optical filter having sharply defined edges. The thin optical filters can be designed with transmission characteristics designed to emulate the weighted spectral response of specific chemicals, or composition related parameters. Separate filters can be produced in a pattern to measure simultaneously several chemicals or parameters. The filters are cast in patterns that overlay the detector elements in imaging detectors. The resulting optical filters are then bonded to the detector or alternatively to a piece of glass that is then bonded to the detector. When placed on a two dimensional detector in a camera, an imaging system capable of showing spatial variation in chemicals or other parameters is produced.

It is therefore clear that a primary object of this invention is to advance the art of optical filter detector array manufacture. A more specific object is to advance said art by providing a method for the manufacture of monolithic patterned dichroic filters having sharply defined edges which can then be bonded to detectors to create a high performance spectral detector for spectroscopic imaging.

These and other important objects, features, and advantages of the invention will become apparent as this description proceeds. The invention accordingly comprises the features of construction, combination of elements and arrangement of parts that will be exemplified in the construction hereinafter set forth, and the scope of the invention will be indicated in the claims.

BRIEF DESCRIPTION OF THE DRAWINGS

For a fuller understanding of the nature and objects of the invention, reference should be made to the following detailed description, taken in connection with the accompanying drawings, in which.

DETAILED DESCRIPTION OF THE PREFERRED EMBODIMENT

Figure 1:
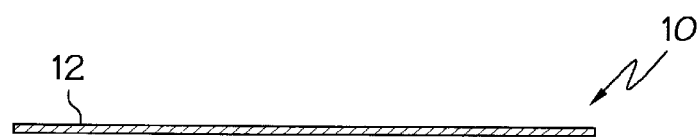
FIG. 1 is the first diagram in an animation that depicts the steps of the novel method.

Referring now to FIG. 1, it will there be seen that the first step in an exemplary embodiment of that includes cleaning and preparing a wafer 12 by conventional means. Rouge and acetone are typically employed in a well-known way resulting in the prepared wafer 12 shown in FIG. 1 and is denoted 10 as a whole.

Figure 2:
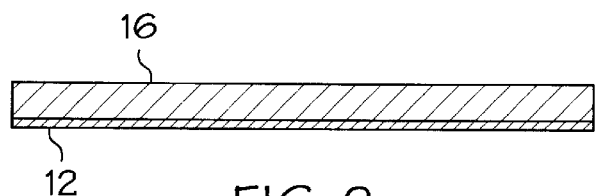
FIG. 2 is the second diagram in the animation.

A suitable photoresist, such as Shipley PR1818, for example, is then applied. In FIG. 2, which depicts the second step of the novel process, the photoresist is denoted by the reference numeral 16; it is about 0.8–2.5 microns in thickness. Photoresist layer 16 is applied by a conventional spin technique, well known in the art, and is then baked to remove solvents therefrom in the well-known way.

Figure 3:
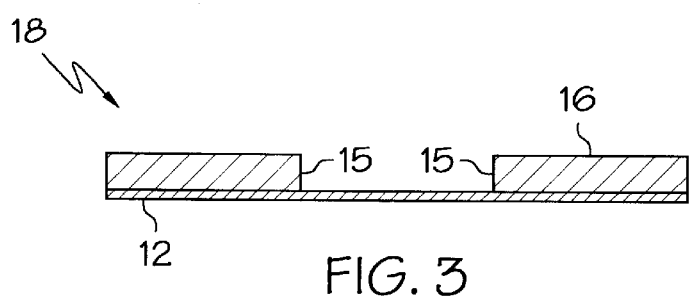
FIG. 3 is the third diagram in the animation.

The assembly is then contact or proximity printed to a mask for one of the three primary colors in the case of dichroic filters for color measurement, or one of several filters representing a set of coefficients in the spectral model. For chemical sensing the unmasked part of the photoresist is exposed to ultraviolet light and developed. The resulting structure is depicted in FIG. 3 and is denoted 18 as a whole; note the photoresist 16 is removed in the area where the optical filter will be positioned.

Figure 4:
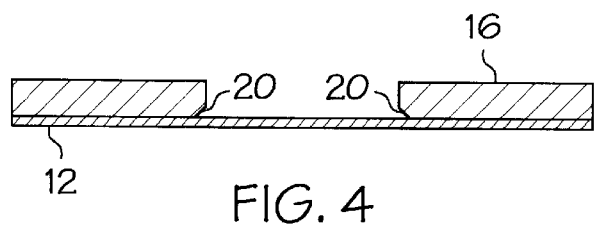
FIG. 4 is the fourth diagram in the animation.

The photoresist is then removed in the manner depicted in FIG. 4. It is critical to observe undercut 20 that is formed during this step of the novel method, i.e., the included angle between wafer 12 and photoresist 16 is less than ninety degrees as depicted. The undercut is formed by slightly over-developing the photoresist layer. Because of their angle, the resulting walls of the photoresist 16 are unstable. In the prior art etching process described above, maintaining stable, perfectly upright walls is considered essential.

Figure 5:
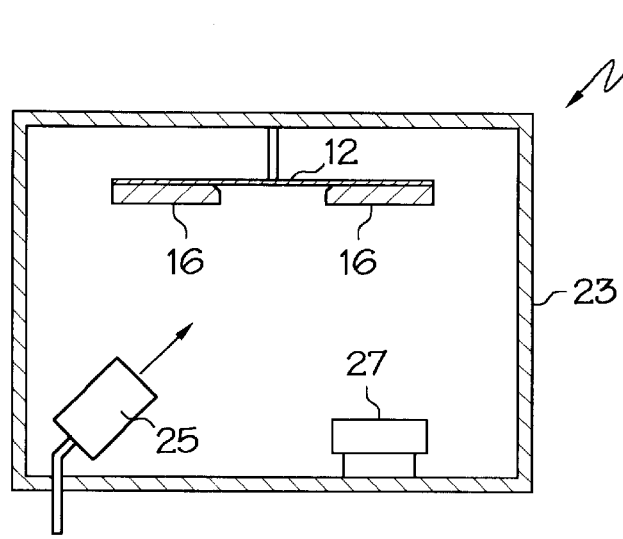
FIG. 5 is the fifth diagram in the animation that provides a side view, in sectional form, of the assembly positioned in a vacuum coating chamber.

The next step of the novel process is depicted in FIG. 5 and is denoted 22; the assembly of FIG. 4 is cleaned in a vacuum coating chamber 23 by ion bombardment with argon gas from gun 25. Electron gun 27 shown in FIG. 5 is used to evaporate dichroic filter material after the assembly of FIG. 4 is cleaned. This is a standard cleaning step, well known in the art, for removing residual photoresist. This step prepares the assembly of FIG. 4 to receive the filter material.

Figure 6:
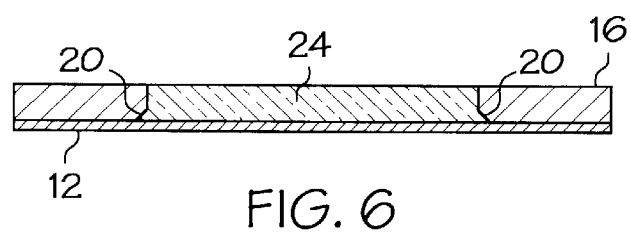
FIG. 6 is the sixth diagram in the animation.

FIG. 6 depicts the assembly after the dichroic filter material 24 has been deposited upon the wafer. Significantly, said filter material 24 is evaporated onto the wafer by a "cold process." More particularly, filter material 24 is deposited by alternating non quarterwave high low index stacks via electron beam deposition with ion assist specific for each color bandpass. Quarterwave high low index stacks are of minimal effectiveness, because they produce a filter that is unacceptably thick. It has been experimentally shown that alternating non quarterwave stacks such as silicon dioxide can be deposited at a rate of about 2 to 15 angstroms per second and titanium oxide can be deposited at a rate of about 1 to 15 angstroms per second. Studies have also shown that different materials may be substituted for the ones used pending the design parameters needed to be achieved. The ion gun should be set at a gas flow of about 18 sccm (standard cubic centimeters per minute). A current of about 1.75 amps and a voltage of about 75 volts should be applied to the anode of the ion gun. The emission rate should be about 2.00 amps. All of these values can vary by about twenty percent (20%). Empirical studies might hereafter determine different ideal settings for the ion gun, and such ideal settings are within the scope of this invention.

It is critical to note the space in FIG. 6 created by undercut 20 since this area is not filled up filter material 24. The electron beam deposition described above produces filter material 24 with vertical, i.e., ninety degree walls.

As the process depicted in FIG. 5 is underway, the optical filter material is simultaneously deposited on another substrate to create what is known in the art as a "witness sample." The witness sample is inspected on a spectrophotometer; it is not patterned with images. The data thereby collected is interfaced with a suitable software program designed to interpolate the data to the CIE colormetric scale. A lot traveler is then marked with the observed color coordinates on the CIE chart.

Figure 8:
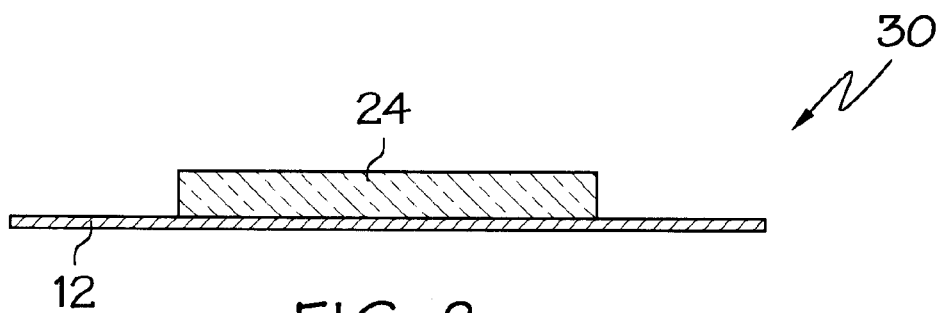
FIG. 8 is the eighth diagram in the animation.

A suitable stripper, i.e., a photoresist remover such as acetone, is then employed to produce the assembly 30 depicted in FIG. 8. Preferably, the wafer is soaked in acetone with agitation; this swells the photoresist 16 and removes it.

Figure 7:
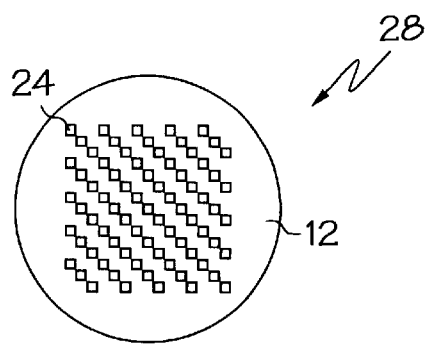
FIG. 7 is the seventh diagram in the animation that provides a top plan view of the wafer after the step of FIG. 5.
Figure 9:
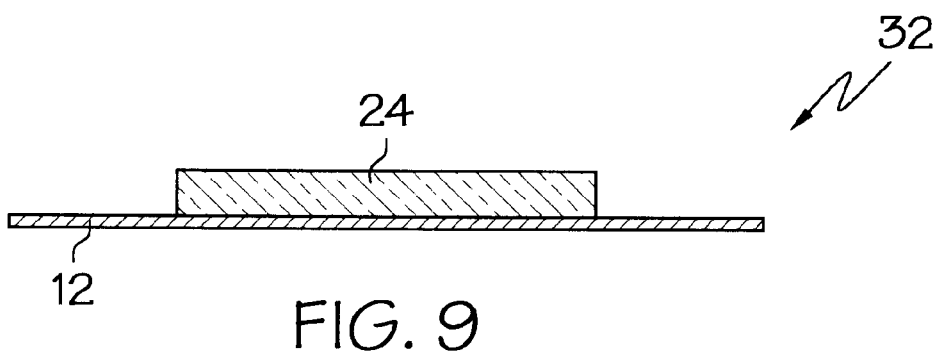
FIG. 9 is the ninth diagram in the animation.
Figure 11:
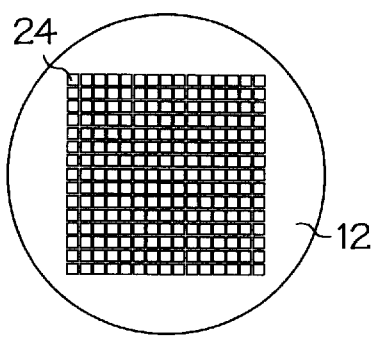
FIG. 11 is a top plan view of the finished wafer.

The resulting structure of one item of filter material is depicted in FIG. 9 as at 32, and in FIG. 7, as 24. It should be understood that a plurality of filter material members 24, all having a common color, are manufactured simultaneously by following the steps disclosed herein. As shown in FIG. 7, after all of the filter material members 24 of a first color have been deposited onto wafer 12, in spaced apart relation to one another as indicated in FIG. 7, the spaces are then filled by repeating the novel process a second time with filter material 24 of a second color, and by then repeating the novel process a third time with a third color. Thus, FIG. 11 depicts a finished wafer.

Note the sharply defined edges of the optical filter 24. Just as importantly, filter material 24 has a thickness of approximately 1.4 microns, i.e., about one-fourth as thick as conventionally manufactured filters. It is virtually impossible to produce a filter having such sharply defined edges when following the steps of the conventional etching method described earlier.

Figure 10:
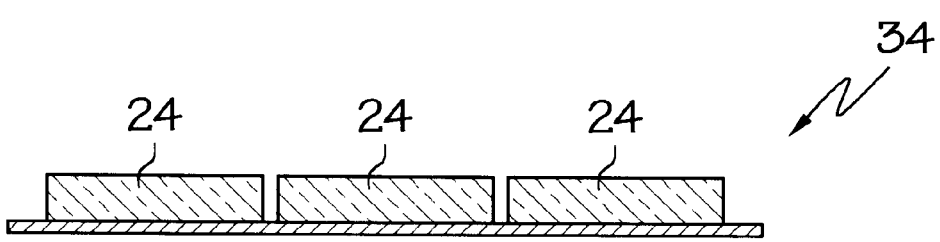
FIG. 10 is the tenth diagram in the animation.

The basic color filter unit depicted in FIG. 9 will have a blue, red, or green color and when the novel process is finished, will be flanked by similar units of filters having one of said primary colors. FIG. 10 depicts a three color matrix 34. Significantly, it is a simple matter to construct additional dichroic filter units 24 contiguous to the unit first manufactured by following the steps disclosed above. Each unit will have sharply defined edges and uniform thickness.

In the preferred embodiment the characteristics of the filters produced are determined from generally accepted standard spectral functions such as the CIE color functions, the photopic response of the human eye, industry specific definitions of color, or any spectrally defined functions such as the definitions for UVA, UVB and UVC radiation. Alternatively, the filters may be defined for specific applications involving the detection of chemicals, or the estimation of parameters that may be related to chemical composition by using conventional chemometric modeling of conventional spectroscopy data of the compounds or parameters of interest.

In chemometric modeling, the concentration of the chemical to be analyzed is related to the light intensity received by the spectrometer at each wavelength through statistical analysis of the spectra of a series of standards with known concentration. In the preferred embodiment, these coefficients are scaled so that they also equal the relative transmission of an optical filter required to produce the same attenuation or weighting of the signal produced by the CCD detector as the mathematical weighting of the model. Chemometric models can have several sets of coefficients, representing for example negative coefficients that remove the effects of interfering substances from the model results, or that are proportional to the concentrations of additional substances of interest in a multi-component application. Each set of coefficients will be used as the design for an optical filter in the array, in a fashion similar to using different filters for the different colors in the color filter unit. Interpretation of the data from the area array will involve further mathematical manipulation, such as the subtraction of the signal from an adjacent pixel covered by a filter representing negative model coefficients from the signal obtained from a pixel covered by a filter representing a positive coefficient. This manipulation can take place through analog circuitry, or through software processing of digitized data from the detector pixels. A monolithic array of thin film optical filters that match the coefficients of the models are designed using conventional thin film analysis software. Thus the filter array can be designed in software to emulate the spectral response of the target chemical. In general, all substances interact with light, and the relative amount of light that is transmitted through the sample (% T) or reflected by the sample (% R) that is related to a particular compound or parameter in the sample can be determined by analyzing a series of samples with known levels. These techniques result in a calibration model, expressed as a series of coefficients or factors at each wavelength. In the preferred embodiment of this invention, a physical filter would be designed and produced that mimics the mathematical filter represented by the calibration coefficients. Discrimination can be improved by including several filters, such that interfering substances or multiple parameters can be derived from the difference in signals obtained through the different filters. The size of each dichroic filter, the spacing between the filters, the overall design of the array, and other parameters may be easily changed to meet customer specifications. FIG. 11 depicts a finished wafer as aforesaid.

Figure 12:
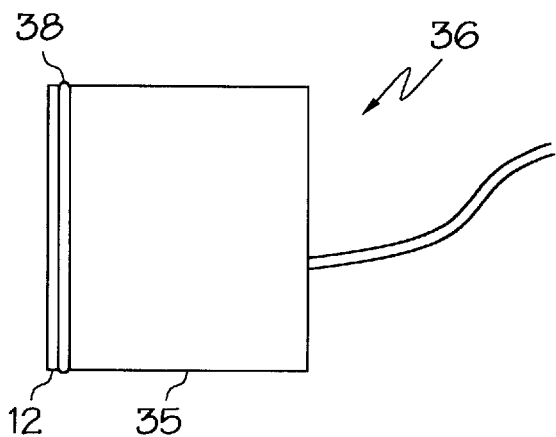
FIG. 12 is a diagram showing the finished wafer applied to a detector.
Figure 13:
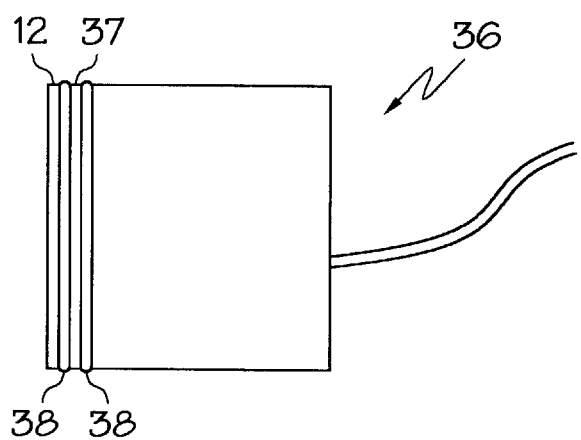
FIG. 13 is a diagram showing the finished wafer applied to a glass window that is then applied to the detector.

FIG. 12 shows the finished wafer 12 with all the filter material 24 on the wafer 12 bonded onto a linear detector 35 with any optically clear adhesive 38, well known to those skilled in the art, to form the finished dichroic filter detector array 36. FIG. 13 shows the finished wafer 12 with all the filter material 24 on the wafer 12 bonded to a glass window 37 with optically clear adhesive 38. The glass window 37 is then bonded to the linear detector 35 with optically clear adhesive 38 to form an alternative embodiment of the invention. Regardless of which bonding method is used the thin film optical filters can have transmission characteristics designed to emulate the weighted spectral response of specific chemicals, or composition related parameters. Separate filters can be produced in a pattern to measure simultaneously several chemicals or parameters. The filters are cast in patterns that overlay the detector elements in imaging detectors. When placed on a two dimensional detector in a camera, an imaging system capable of showing spatial variation in chemicals or other parameters is produced.

It will thus be seen that the objects set forth above, and those made apparent from the foregoing description, are efficiently attained. Since certain changes may be made in the foregoing construction without departing from the scope of the invention, it is intended that all matters contained in the foregoing construction or shown in the accompanying drawings shall be interpreted as illustrative and not in a limiting sense.

What is claimed is:

1. A method for manufacturing a dichroic filter detector array, comprising the steps of:
   a. cleaning a wafer,
   b. applying a photoresist to said wafer;
   c. masking pre-selected areas of said photoresist;
   d. developing unmasked areas of said photoresist to create a pre-selected space
   e. over-developing said photoresist layer to form an undercut in said photoresist layer and to expose a predetermined section of said wafer;
   f. depositing dichroic filter material on said predetermined section of said wafer;
   g. removing said photoresist,
   h. repeating the foregoing steps to deposit a predetermined number of dichroic filters on said wafer in a predetermined array; and,
   i. bonding said wafer on a linear detector with optically clear adhesive.

2. The method of claim 1, wherein said photoresist is applied to said wafer until said photoresist has a thickness of about 0.8 to 2.5 microns, and said photoresist is baked to remove solvents therefrom.

3. The method of claim 1, wherein said masking of said photoresist is performed by contact printing.

4. The method of claim 1, wherein said masking of said photoresist is performed by proximity printing.

5. The method of claim 1, further comprising the step of cleaning said wafer after said step of over-developing.

6. The method of claim 5, wherein said step of cleaning said wafer is performed by placing said wafer in a vacuum coating chamber and ion bombarding said wafer with argon.

7. The method of claim 1, wherein said dichroic filter material is deposited onto said wafer by employing electron beam deposition with ion assist specific for a pre-selected bandpass.

8. The method of claim 7, wherein said dichroic filter material is deposited onto said wafer by employing electron beam deposition with ion assist specific for a pre-selected bandpass that emulates the weighted spectral response of specific chemicals or composition related parameters.

9. The method of claim 8, wherein said dichroic filter material is deposited onto said wafer by employing electron beam deposition with ion assist specific for a pre-selected bandpass that emulates the weighted spectral response of specific chemicals or composition related parameters wherein said pre-selected bandpass is predetermined by mathematical modeling implemented in a software program.

10. The method of claim 7, wherein said electron beam deposition with ion assist deposits alternating nonquarterwave high low index stacks of said dichroic filter material onto said wafer.

11. The method of claim 10, wherein in said electron beam deposition with ion assist deposits alternating nonquarterwave high low index stacks of dichroic filter material and further consists of depositing low index material at a rate of 2 to 15 angstrom per second and depositing high index material at a rate of 1 to 15 angstroms per second onto said wafer.

12. The method of claim 1, further comprising the steps of:
   a. creating a witness sample when said dichroic filter material is being deposited to said wafer; and,
   b. inspecting said witness sample on a spectrophotometer, determining the color coordinates of said witness sample, and marking a lot traveler with said observed color coordinates.

13. The method of claim 1, further comprising the steps of:
   a. creating a witness sample when said dichroic filter material is being deposited to said wafer; and,
   b. inspecting said witness sample on a spectrophotometer, determining the observed chemometric model coefficients of said witness sample, and marking a lot traveler with said observed chemometric model coefficients.

14. A method for manufacturing a dichroic filter detector array, comprising the steps of:
   a. cleaning a wafer;
   b. applying a photoresist to said wafer;
   c. masking pre-selected areas of said photoresist;
   d. over developing unmasked areas of said photoresist to create a pre-selected space where said wafer is exposed;
   e. depositing dichroic filter material on said predetermined section of said wafer; removing said photoresist;
   f. repeating the foregoing steps to deposit a predetermined number of dichroic filters on said wafer in a predetermined array;
   g. bonding the wafer on a glass window with optically clear adhesive; and,
   h. bonding said glass window to a linear detector with optically clear adhesive.

15. The method of claim 14, wherein said photoresist is applied to said wafer until said photoresist has a thickness of about 0.8 to 2.5 microns, and said photoresist is baked to remove solvents therefrom.

16. The method of claim 14, wherein said masking of said photoresist is performed by contact printing.

17. The method of claim 14, wherein said masking of said photoresist is performed by proximity printing.

18. The method of claim 14, further comprising the step of cleaning said wafer after said step of over-developing.

19. The method of claim 18, wherein said step of cleaning said wafer is performed by placing said wafer in a vacuum coating chamber and ion bombarding said wafer with argon.

20. The method of claim 14, wherein said dichroic filter material is deposited onto said wafer by employing electron beam deposition with ion assist specific for a pre-selected bandpass.

21. The method of claim 20, wherein said dichroic filter material is deposited onto said wafer by employing electron beam deposition with ion assist specific for a pre-selected bandpass that emulates the weighted spectral response of specific chemicals or composition related parameters.

22. The method of claim 21, wherein said dichroic filter material is deposited onto said wafer by employing electron beam deposition with ion assist specific for a pre-selected bandpass that emulates the weighted spectral response of specific chemicals or composition related parameters wherein said pre-selected bandpass is predetermined by mathematical modeling implemented in a software program.

23. The method of claim 20, wherein said electron beam deposition with ion assist deposits alternating nonquarterwave high low index stacks of said dichroic filter material onto said wafer.

24. The method of claim 23, wherein said electron beam deposition with ion assist deposits alternating nonquarterwave high low index stacks of dichroic filter material and further consists of depositing low index material at a rate of 2 to 15 angstrom per second and depositing high index material at a rate of 1 to 15 angstroms per second onto said wafer.

25. The method of claim 14, further comprising the steps of:

a. creating a witness sample when said dichroic filter material is being deposited to said wafer; and,
b. inspecting said witness sample on a spectrophotometer, determining the color coordinates of said witness sample, and marking a lot traveler with said observed color coordinates.

26. The method of claim 14, further comprising the steps of:

a. creating a witness sample when said dichroic filter material is being deposited to said wafer; and,
b. inspecting said witness sample on a spectrophotometer, determining the observed chemometric model coefficients of said witness sample, and marking a lot traveler with said observed chemometric model coefficients.

\* \* \* \* \*